(12) United States Patent
Puzzilli et al.

(10) Patent No.: US 8,228,735 B2
(45) Date of Patent: Jul. 24, 2012

(54) MEMORY ARRAY HAVING MEMORY CELLS COUPLED BETWEEN A PROGRAMMABLE DRAIN SELECT GATE AND A NON-PROGRAMMABLE SOURCE SELECT GATE

(75) Inventors: Giuseppina Puzzilli, Boise, ID (US); Andrew Bicksler, Boise, ID (US); Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 310 days.

(21) Appl. No.: 12/707,162

(22) Filed: Feb. 17, 2010

(65) Prior Publication Data

US 2011/0199827 A1  Aug. 18, 2011

(51) Int. Cl.
*G11C 16/04* (2006.01)

(52) U.S. Cl. ......... 365/185.14; 365/185.17; 365/185.18; 365/185.2

(58) Field of Classification Search ............. 365/185.14, 365/185.17, 185.18, 185.2
See application file for complete search history.

(56) References Cited

U.S. PATENT DOCUMENTS

| | | | | |
|---|---|---|---|---|
| 7,079,437 B2 * | 7/2006 | Hazama et al. | ......... | 365/210.12 |
| 7,239,556 B2 * | 7/2007 | Abe et al. | ........... | 365/185.33 |
| 7,272,049 B2 * | 9/2007 | Kang et al. | ........... | 365/185.2 |
| 8,018,782 B2 * | 9/2011 | Park et al. | ........... | 365/185.29 |
| 2009/0287879 A1 * | 11/2009 | Oh et al. | ....... | 711/103 |

* cited by examiner

*Primary Examiner* — Connie Yoha
(74) *Attorney, Agent, or Firm* — Leffert Jay & Polglaze, P.A.

(57) ABSTRACT

Memories and their memory arrays are disclosed. One such memory array has a string of series-coupled memory cells, a non-programmable select gate coupled in series to a first end of the string of series-coupled memory cells, and a programmable select gate coupled in series to a second end of the string of series-coupled memory cells.

21 Claims, 4 Drawing Sheets

MEMORY ARRAY HAVING MEMORY CELLS COUPLED BETWEEN A PROGRAMMABLE DRAIN SELECT GATE AND A NON-PROGRAMMABLE SOURCE SELECT GATE

FIELD

The present disclosure relates generally to memories, and, in particular, the present disclosure relates to memory arrays having memory cells coupled between a programmable drain select gate and a non-programmable source select gate.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming (which is sometimes referred to as writing) of charge storage nodes (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, and removable memory modules.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line. A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

The source and drain select gates may be field-effect transistors having a fixed threshold voltage, i.e., a non-programmable threshold voltage. Due to variations in fabrication, such fixed threshold voltage field-effect transistors will often have varying threshold voltages for select gates coupled to the same control line. To address this variability, alternative configurations have replaced the fixed threshold voltage field-effect transistors of both the source and drain select gates with charge storage cells having charge storage nodes, e.g., similar to memory cells. For example, such source and drain select gates are sometimes referred to as programmable source and drain select gates. The threshold voltages of both charge storage cells acting as select gates are typically adjusted to a particular programmed state and are typically not erased during erase operations performed on the corresponding NAND string of memory cells.

In configurations using charge storage cells for the source and drain select gates, "dummy" word lines are typically located between the programmable select gates and the NAND string of memory cells to protect the threshold voltages programmed into respective source and drain select gates from being changed during erase operations performed on the corresponding NAND string of memory cells. This leads to added complexity and real estate to the memory array.

The memory array is accessed by a row decoder activating a row of memory cells by selecting the word line connected to (and, in some cases, formed by) a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the column bit line to the source line through each NAND string via the corresponding select gates, restricted only by the selected memory cells of each string. This places the current-encoded data values of the row of selected memory cells on the column bit lines.

For some applications, flash memory stores a single bit per cell. For example, cells that store a single bit per cell are sometimes called single-level cells (SLCs). Each single-level cell is characterized by a specific threshold voltage, which is sometimes referred to as the Vt-level. Within each cell, two or more possible Vt-levels exist. These Vt-levels are controlled, for example, by the amount of charge that is programmed or stored on the charge storage nodes. For some NAND architectures, for example, a memory cell might have a Vt-level greater than zero in a programmed (e.g., logic zero) state and a Vt-level less than zero in an erase (e.g., logic one) state.

For other applications, flash memory may store multiple bits per cell. For example, cells that store multiple bits per cell are sometimes called multi-level cells (MLCs). For example, multi-level cells generally have different program Vt-level distributions, with each distribution corresponding to a distinct data state, thereby representing different data values or bit patterns.

For the reasons stated above, and for other reasons stated below which will become apparent to those skilled in the art upon reading and understanding the present specification, there is a need in the art for alternatives to the select gates being used in existing memory arrays.

DETAILED DESCRIPTION

Figure 1:
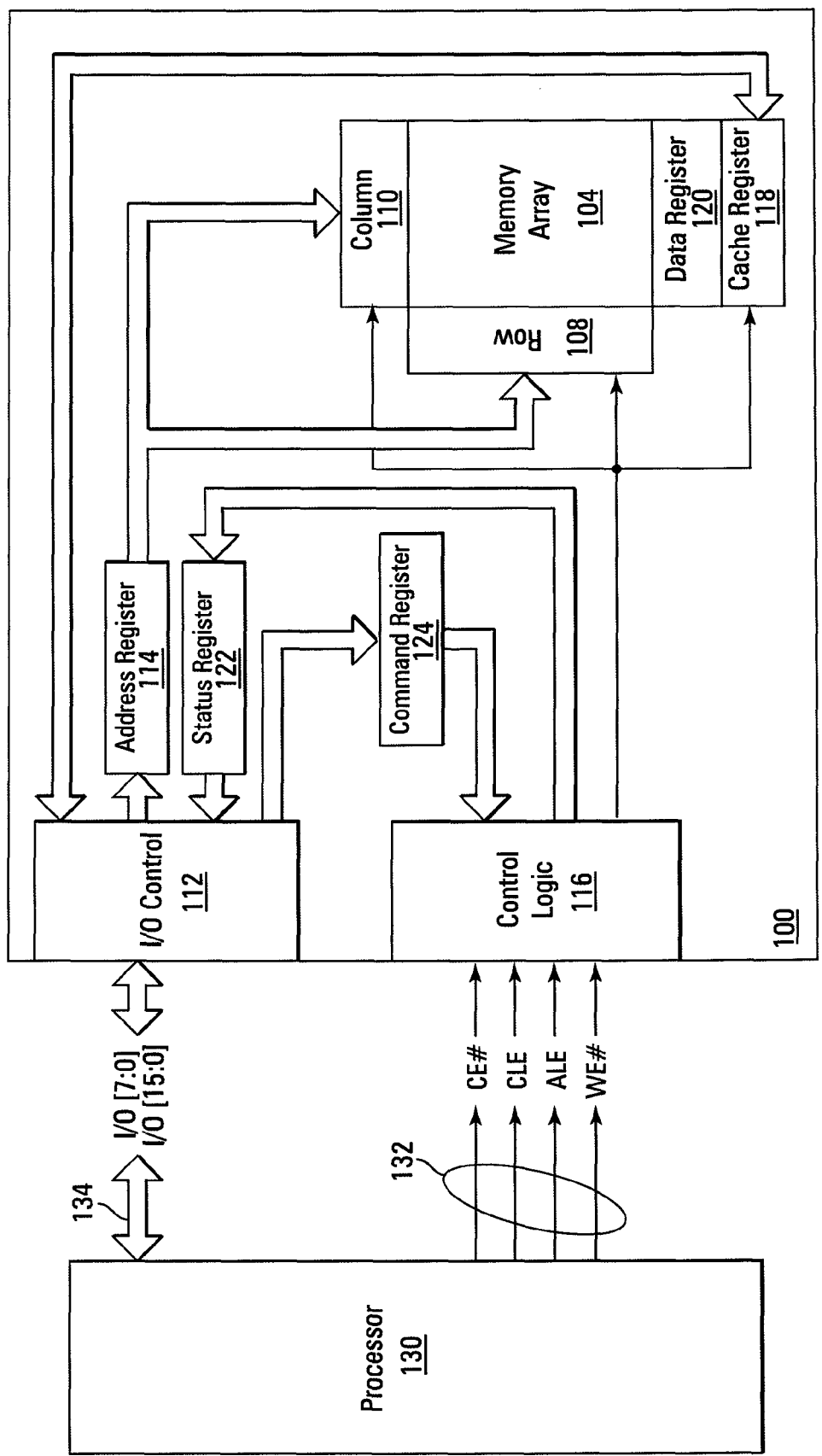
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The following detailed description is, therefore, not to be taken in a limiting sense, and the scope of the present disclosure is defined only by the appended claims and equivalents thereof.

FIG. 1 is a simplified block diagram of a NAND flash memory device 100 in communication with a processor 130 as part of an electronic system, according to an embodiment. The processor 130 may be a memory controller or other external host device. Memory device 100 includes an array of memory cells 104, according to embodiments of the disclosure. For example, memory array 104 may include a string of series-coupled memory cells interposed between and coupled in series with a non-programmable source select gate and a programmable drain select gate.

A row decoder 108 and a column decoder 110 are provided to decode address signals. Address signals are received and decoded to access memory array 104.

Memory device 100 also includes input/output (I/O) control circuitry 112 to manage input of commands, addresses and data to the memory device 100 as well as output of data and status information from the memory device 100. An address register 114 is in communication with I/O control circuitry 112, and row decoder 108 and column decoder 110 to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
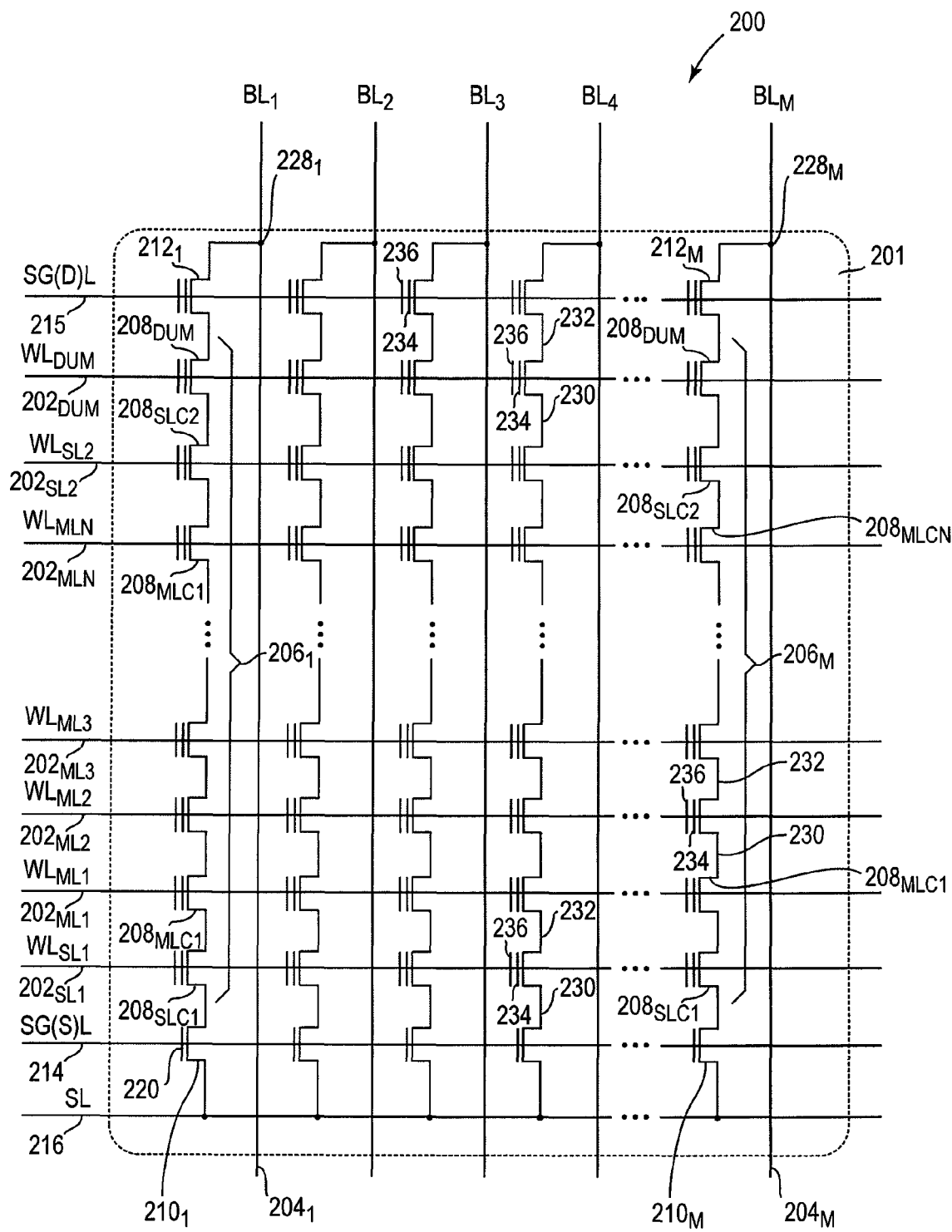
FIG. 2 is a schematic of a NAND memory array, according to another embodiment.

FIG. 2 is a schematic of a NAND memory array 200, e.g., as a portion of memory array 104. Memory array 200 may be formed in a common conductively doped region (e.g., a common p-well) 201 formed in a semiconductor.

Memory array 200 includes access lines, such as word line ($WL_{SL1}$) $202_{SL1}$; word lines $202_{ML1}$ ($WL_{ML1}$) to $202_{MLN}$ ($WL_{MLN}$), where N may generally be some power of 2 minus 1, e.g., 1, 3, 7, 15, 31, 63, 127, etc.; and word line ($WL_{SL2}$) $202_{SL2}$. Memory array 200 may further include a "dummy" access line, such as "dummy" word line ($WL_{DUM}$) $202_{DUM}$. The access lines intersect local data lines, such as local bit lines $204_1$ ($BL_1$) to $204_M$ ($BL_M$). The local bit lines 204 may be coupled to global bit lines (not shown) in a many-to-one relationship.

Memory array 200 is organized in rows and columns, with each column including a string, such as a NAND string 206. For example, memory array 200 may include NAND strings $206_1$ to $206_M$. Each NAND string 206 is coupled to common source line 216 (SL) and includes memory cells 208, such as non-volatile memory cells for storage of data. For example, memory cells 208 may be floating-gate transistors, each located at an intersection of a word line 202 and a local bit line 204. The memory cells 208 of each NAND string 206 are coupled (e.g., connected) in series, source to drain, between a non-programmable source select gate (SG(S)) 210, e.g., a fixed threshold voltage field effect transistor (FET), and a programmable drain select gate (SG(D)) 212, e.g., a variable threshold voltage FET. That is, the NAND strings 206 are located between and are coupled in series with non-programmable source select gates 210 and programmable drain select gates 212 on a one-to-one basis, as shown in FIG. 2.

A source of each non-programmable source select gate 210 is coupled (e.g., connected) to common source line 216 and thus each non-programmable source select gate 210 selectively couples its respective NAND string 206 to common source line 216. The drains of non-programmable source select gates $210_1$ to $210_M$ are respectively coupled (e.g., connected) to the sources of the first memory cells, e.g., memory cells programmable as single-level memory cells, such as single-level memory cells $208_{SLC1}$, of NAND strings $206_1$ to $206_M$. For example, the drain of source select gate $210_1$ is coupled (e.g., connected) to the source of a single-level memory cell $208_{SLC1}$ of the corresponding NAND string $206_1$. Source select line (SG(S)L) 214 is coupled (e.g., connected) to (or, for some embodiments, formed by) control gates 220 of non-programmable source select gates $210_1$ to $210_M$.

Each of memory cells 208 includes a source 230, a drain 232, a charge storage node 234 (e.g., a floating gate, charge trap, etc.), and a control gate 236, as shown in FIG. 2. Memory cells 208 have their control gates 236 coupled to (or, for some embodiments, formed by) a word line 202. Note the control gates 236 some times form a corresponding word line 202. A column of memory cells 208 includes a NAND string 206 coupled to a given local bit line 204. A row of the memory cells 208 are those memory cells commonly coupled to a given word line 202. Note that memory cells programmable as single-level memory cells and memory cells programmable as multi-level memory cells generally utilize the same physical configuration.

The drains of programmable drain select gates $212_1$ to $212_M$ are respectively coupled (e.g., connected) to local bit lines $204_1$ to $204_M$, respectively corresponding to NAND strings $206_1$ to $206_M$, at the respective drain contacts $228_1$ to $228_M$. For example, the drain of programmable drain select gate $212_1$ is coupled (e.g., connected) to the local bit line $204_1$ for the corresponding NAND string $206_1$ at drain contact $228_1$. The sources of programmable drain select gates $212_1$ to $212_M$ are respectively coupled (e.g., connected) to the drains of the last memory cells, e.g., "dummy" memory cells $208_{DUM}$, of corresponding NAND strings $206_1$ to $206_M$. For example, the source of programmable drain select gate $212_1$ is coupled (e.g., connected) to the drain of a dummy memory cell $208_{DUM}$ of the corresponding NAND string $206_1$. Note that the programmable drain select gate 212 selectively couples its respective NAND string 206 to a bit line 204. For example, programmable drain select gate $212_1$ selectively couples NAND string $206_1$ to bit line $204_1$, as shown in FIG. 2.

Each programmable drain select gate 212 may be configured in a manner similar to a memory cell 208. For example, each programmable drain select gate 212 may be a charge storage cell having a charge storage node 234 and a control gate 236 coupled to drain select line (SG(D)L) 215. For example, drain select line 215 may be coupled to (or, for some embodiments, formed by) the control gates 236 of drain select gates $212_1$ to $212_M$.

For some embodiments, each NAND string 206 may include a memory cell programmable as a single-level memory cell, such as single-level memory cell $208_{SLC1}$, located between and coupled in series with a non-programmable source select gate 210 and a memory cell programmable as a multi-level memory cell, such as a multi-level memory cell $208_{MLC1}$. Each NAND string 206 also includes a string of series-coupled multi-level memory cells $208_{MLC1}$ to $208_{MLCN}$ and a memory cell programmable as a single-level memory cell, such as a single-level memory cell $208_{SLC2}$, coupled in series with multi-level memory cell $208_{MLCN}$. Each NAND string 206 may further include "dummy" memory cell $208_{DUM}$ located between and coupled in series with single-level memory cell $208_{SLC2}$ and a programmable drain select gate 212. However, for other embodiments, multi-level memory cells $208_{MLC1}$ to $208_{MLCN}$ may be replaced with single-level cells.

Note that for some embodiments, the control gates 220 of a row of non-programmable source select gates 210 may be commonly coupled to source select line 210; the control gates 236 of the row of single-level memory cells $208_{SLC1}$ may be commonly coupled to word line $202_{SL1}$; the control gates 236 of the rows of multi-level memory cells $208_{MLC1}$ to $208_{MLCN}$ may be respectively commonly coupled to word lines $202_{ML1}$ to $202_{MLN}$; the control gates 236 of the row of single-level memory cells $208_{SLC2}$ may be commonly coupled to word line $202_{SL2}$; the control gates 236 of the row of dummy memory cells $208_{DUM}$ may be commonly coupled to word line $202_{DUM}$; and the control gates 236 of the row of programmable drain select gates 212 may be commonly coupled to drain select line 215.

Figure 3:
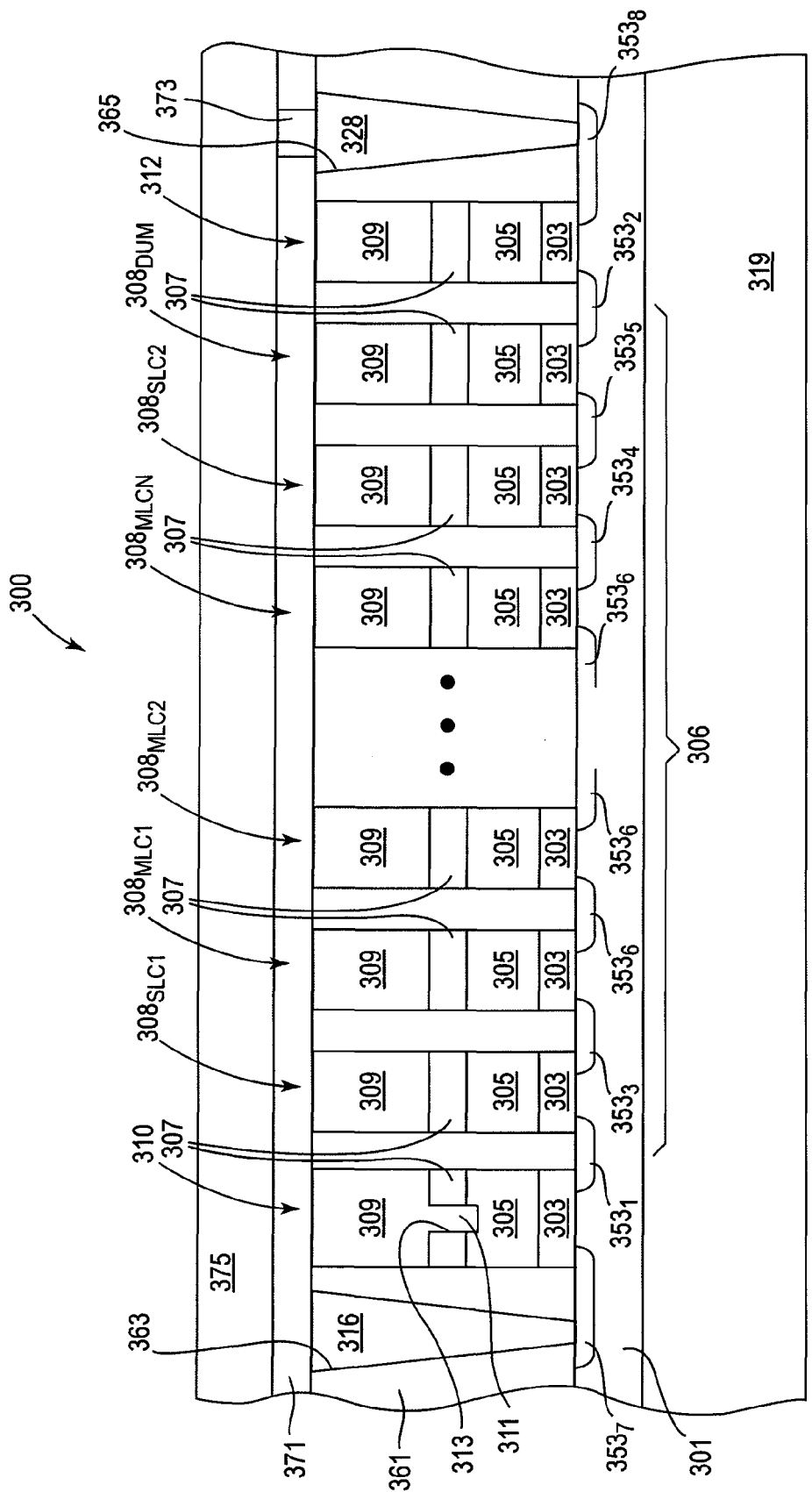
FIG. 3 is a cross-sectional view of a column of a memory array, according to another embodiment.

FIG. 3 is a cross-sectional view of a column 300 of a memory array, such as a column of memory array 200 of FIG. 2. Column 300 includes a string of series-coupled memory cells, e.g., a NAND string 306 of series-coupled memory cells, located between and coupled (e.g., connected) in series with a non-programmable source select gate 310 and a programmable drain select gate 312.

That is, NAND string 306 may include memory cells 308 coupled in series, source to drain. For example, NAND string 306 may include a single-level memory cell $308_{SLC1}$ located between and coupled in series with non-programmable source select gate 310 and a multi-level memory cell $308_{MLC1}$ of a string of series-coupled multi-level memory cells $308_{MLC1}$ to $308_{MLCN}$. NAND string 306 also includes the string of series-coupled multi-level memory cells $308_{MLC1}$ to $308_{MLCN}$ and a single-level memory cell $308_{SLC2}$ coupled in series with multi-level memory cell $308_{MLCN}$. NAND string 306 may further include a dummy memory cell $308_{DUM}$ located between and coupled in series with single-level memory cell $308_{SLC2}$ and programmable drain select gate 312. Note that for other embodiments, the string of series-coupled multi-level memory cells $308_{MLC1}$ to $308_{MLCN}$ may be replaced with a string of series-coupled single-level memory cells.

A dielectric 303, e.g., an oxide, is formed over a common conductively doped region 301, such as a p-well, formed in a semiconductor 319, such as monocrystalline silicon wafer or the like. In general, dielectric 303 includes one or more dielectric materials. Dielectric 303 forms a tunnel dielectric, e.g., a tunnel oxide, of each of memory cells 308 and of programmable drain select gate 312 and a gate dielectric, e.g., a gate oxide, of non-programmable source select gate 310.

A charge storage node 305, such as doped polysilicon, is formed over dielectric 303. Charge storage node 305 forms, for example, a floating gate of each of memory cells 308 and of programmable drain select gate 312. While charge storage node 305 may be formed of one or more conductive charge trapping materials, such as the doped polysilicon in this example, other types of charge trapping materials are also suitable. Some other examples of charge trapping materials include dielectric charge trapping materials or conductive nanodots in a dielectric carrier.

A dielectric 307 is formed over charge storage node 305. Dielectric 307 includes one or more dielectric materials and can be silicon oxide, nitride, oxynitride, oxide-nitride-oxide (ONO), or other dielectric material. Dielectric 307 forms an interlayer dielectric of each of memory cells 308 and of programmable drain select gate 312. It is noted that where the charge storage node 305 functions as a dielectric, one or both of dielectrics 303 and dielectric 307 could be eliminated in the memory cells 308 and programmable drain select gate 312.

A conductor 309 is formed over dielectric 307 and may form a contact 311 that passes through dielectric 307 of non-programmable source select gate 310 and, for example, that directly, physically contacts charge storage node 305. For example, in embodiments where charge storage node 305 functions as a conductor, an opening 313 (e.g., a slot) may be formed through dielectric 307 of non-programmable source select gate 310 that exposes a portion of charge storage node 305 before forming conductor 309. Subsequently, conductor 309 fills opening 313 to form contact 311 when conductor 309 is formed over dielectric 307.

Contact 311 electrically couples (e.g., connects) conductor 309 to the charge storage node 305 and thus electrically shorts conductor 309 and charge storage node 305 together in embodiments where charge storage node 305 functions as a conductor. For this example, electrically coupled (e.g., connected or shorted) conductor 309 and charge storage node 305 may form a control gate of non-programmable source select gate 310. For example, the control gate may form a portion of a source select line.

Alternatively, contact 311 may be omitted so that conductor 309 and conductor 305 are not electrically coupled (e.g., connected or shorted), in which case a conductive charge storage node 305 may form the control gate of non-programmable source select gate 310. In other embodiments, charge storage node 305 and dielectric 307 may be removed from the dielectric 303 of non-programmable source select gate 310 before conductor 309 is formed, or they may be masked to inhibit formation, and conductor 309 may be subsequently formed over the dielectric 303 of non-programmable source select gate 310 to form the control gate of non-programmable source select gate 310.

Conductor 309 forms a control gate (e.g., a portion of a word line) of each of memory cells 308 and a control gate of programmable drain select gate 312 (e.g., a portion of a drain select line). Note that programmable drain select gate 312 may be a charge storage cell, e.g., a non-volatile charge storage cell, such as a non-volatile memory cell.

Conductor 309 includes one or more conductive materials. Conductor 309 may comprise, consist of, or consist essentially of conductively doped polysilicon and/or may comprise, consist of, or consist essentially of metal, such as a refractory metal, or a metal-containing material, such as a refractory metal silicide layer, as well as any other conductive material. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals.

Source/drain regions 353 are formed in common conductively doped region 301 of semiconductor 300. For example, each of source/drain regions 353 may be doped with a conductivity type that is different, e.g., opposite, the conductivity type of conductively doped region 301. For example, each of source/drain regions 353 may have an n-type conductivity.

Source/drain regions $353_1$ and $353_2$ respectively couple (e.g., connect) opposite ends of NAND string 306 to non-programmable source select gate 310 and programmable drain select gate 312. That is, source/drain region $353_1$ couples (e.g., connects) single-level memory cell $308_{SLC1}$ in series with non-programmable source select gate 310, and source/drain region $353_2$ couples (e.g., connects) dummy memory cell $308_{DUM}$ in series with programmable drain select gate 312. For example, source/drain region $353_1$ couples (e.g., connects) single-level memory cell $308_{SLC1}$ directly in series with non-programmable source select gate 310 with no intervening memory cells, and source/drain region $353_2$ couples (e.g., connects) dummy memory cell $308_{DUM}$ directly in series with programmable drain select gate 312 with no intervening memory cells.

Source/drain regions $353_3$, $353_4$, and $353_5$ respectively couple (e.g., connect) single-level memory cell $308_{SLC1}$ in series with multi-level memory cell $308_{MLC1}$, single-level memory cell $308_{SLC2}$ in series with multi-level memory cell $308_{MLCN}$, and single-level memory cell $308_{SLC2}$ in series with dummy memory cell $308_{DUM}$. Source/drain regions $353_6$ couple multi-level memory cells $308_{MLC1}$ to $308_{MLCN}$ in series.

A dielectric 361, e.g., bulk insulation, is formed over the source/drain regions, NAND string 306, and the select gates. Excess portions of dielectric 361 may be removed, e.g., by chemical mechanical planarization (CMP), stopping on conductor 309, so that an upper surface of dielectric 361 is substantially flush with upper surfaces of conductor 309. Dielectric 361 includes one or more dielectric materials and one example for dielectric 361 would be a doped silicate glass. Examples of doped silicate glasses include BSG (borosilicate glass), PSG (phosphosilicate glass), and BPSG (borophosphosilicate glass). Another example for dielectric 361 would be TEOS (tetraethylorthosilicate).

Opening 363 (e.g., a slot) and an opening 365 (e.g., a hole or slot) may be formed in dielectric 361 to respectively expose at least a portion of source/drain regions $353_7$ and $353_8$. Contacts 316 and 328 are respectively formed in openings 363 and 365, e.g., so that contacts 316 and 328 are respectively in direct physical contact with source/drain regions $353_7$ and $353_8$. For example, contacts 316 and 328 may be formed by overfilling openings 363 and 365 with the same conductor, e.g., using chemical vapor deposition (CVD) or physical vapor deposition (PVD) techniques. Subsequently, a portion of the conductor is removed, e.g., by chemical mechanical planarization (CMP), and a remaining portion of the conductor forms contacts 363 and 365.

The conductor of contacts 363 and 365 includes one or more conductive materials. The conductor of contacts 363 and 365 may comprise, consist of, or consist essentially of a metal or metal-containing layer and may be aluminum, copper, a refractory metal, or a refractory metal silicide layer. In some embodiments, the conductor may contain multiple metal-containing layers, e.g., a titanium nitride (TiN) barrier layer formed over (e.g., in direct physical contact with) source/drain regions $353_7$ and $353_8$, a titanium (Ti) adhesion layer formed over the barrier layer, and a tungsten (W) layer formed over the adhesion layer.

Contact 316 forms a common source line, such as common source line 216 of memory array 200 (FIG. 2), selectively coupled to the NAND string 306 through source select gate 310. Note that source/drain region $353_7$ couples (e.g., connects) contact 316 to non-programmable source select gate 310. Contact 328 forms a bit-line contact, and source/drain region $353_8$ couples (e.g., connects) contact 328 to programmable drain select gate 312.

A dielectric 371, e.g., silicon oxide, TEOS, silicon nitride, silicon oxynitride or other dielectric material, may be formed over dielectric 361 and conductor 309. A contact 373 (e.g., a via plug) may then be formed through the dielectric 371 in contact with bit-line contact 328. Contact 373 may be formed using the same conductor used for forming contacts 316 and 328.

A conductor 375 that may be metal, such as aluminum, or one or more other conductive material is formed over dielectric 371. The conductor 375 may be patterned, etched, and processed, e.g., using standard processing, to produce individual bit lines that are electrically coupled (e.g., connected) to bit line contacts, such as bit line contact 328. Note that NAND string 306 is selectively coupled to a bit line formed from conductor 375 through programmable drain select gate 312.

Figures 4A, 4B, 4C, 4D, 4E:
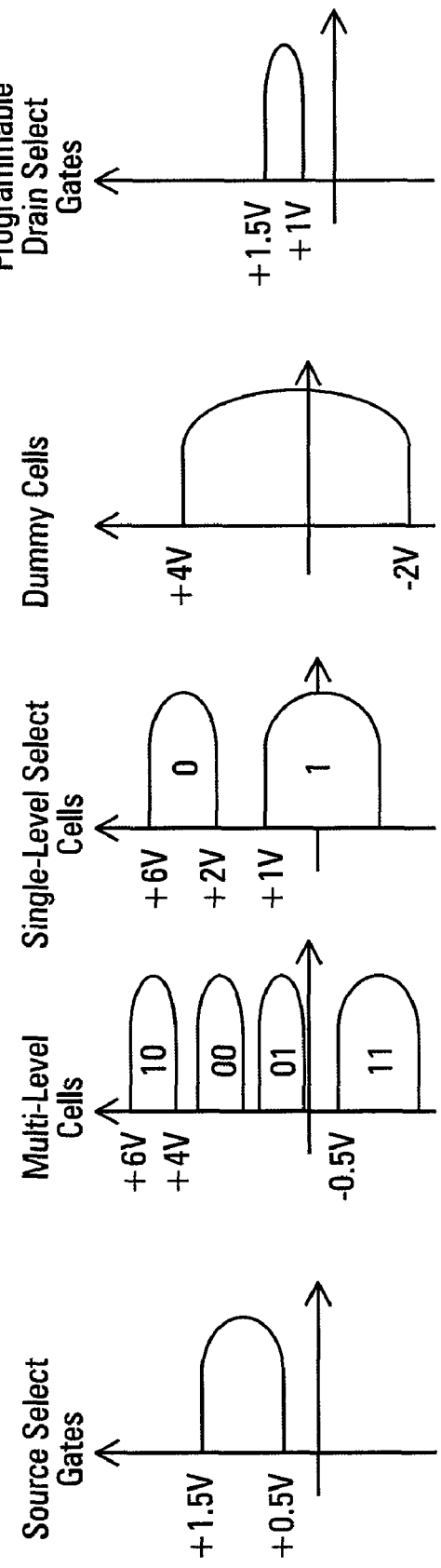
FIG. 4A is an example of a Vt-level distribution for non-programmable source select gates, according to another embodiment.
FIG. 4B is an example of a Vt-level distribution for multi-level memory cells, according to another embodiment.
FIG. 4C is an example of a Vt-level distribution for single-level memory cells, according to another embodiment.
FIG. 4D is an example of a Vt-level distribution for dummy memory cells, according to another embodiment.
FIG. 4E is an example of a Vt-level distribution for programmable drain select gates, according to another embodiment.

FIG. 4 provides examples of possible threshold voltage distributions, sometimes referred to as Vt-level distributions. It is noted that while these Vt-level distributions are considered to be representative of typical values for memory devices as described herein, there is no assertion that these values represent actual measured or experimental values. FIG. 4A is an example of a Vt-level distribution for non-programmable source select gates, such as non-programmable source select gates 210 in FIG. 2 and non-programmable source select gate 310 in FIG. 3. FIG. 4B is an example of Vt-level distributions of possible data states for multi-level cells, such as multi-level memory cells $208_{MLC1}$ to $208_{MLCN}$ in FIG. 2 and multi-level memory cells $308_{MLC1}$ to $308_{MLCN}$ in FIG. 3. FIG. 4C is an example of Vt-level distributions of possible data states for single-level cells, such as single-level memory cells $208_{SLC1}$ and $208_{SLC2}$ in FIG. 2 and single-level memory cells $308_{SLC1}$ and $308_{SLC2}$ in FIG. 3. FIG. 4D is an example of a Vt-level distribution for dummy memory cells, such as dummy memory cells $208_{DUM}$ in FIG. 2 and dummy memory cell $308_{DUM}$ in FIG. 3. FIG. 4E is an example of a Vt-level distribution for programmable drain select gates, such as programmable drain select gates 212 in FIG. 2 and programmable drain select gate 312 in FIG. 3.

FIG. 4A shows that the non-programmable source select gates may have a Vt-level that lies within a voltage range of about 0.5 volt to about 1.5 volts, e.g., as might result from shorting a conductive charge storage node 305 and a conductor 309 together using contact 311 for non-programmable source select gate 312, as shown in FIG. 3.

The multi-level memory cells may store a first data value, represented as a logical 11 and corresponding to an erased state, when the Vt-level is less than about −0.5 volt, and three different logical levels between about zero (0) volts and about 6 volts representative of three additional data values. For example, the multi-level memory cells may store a data value represented as a logical 01 when the Vt-level lies within a voltage range of about zero (0) volts to about 2 volts, a data value represented as a logical 00 when the Vt-level lies within a voltage range of about 2 volts to about 4 volts, and a data value represented as a logical 10 when the Vt-level lies within a voltage range of about 4 volts to about 6 volts. It will be appreciated that the Vt-level ranges corresponding to logical 11, 01, 00, and 10 may be separated by about 0.2V to about 0.4V margins, for example, to keep the Vt-level distributions from overlapping.

The single-level memory cells may store a data value represented as a logical 1 and corresponding to an erased state, when the Vt-level lies within a voltage range of about −1 volt to about 1 volt and a data value represented as a logical zero 0 when the Vt-level lies within a voltage range of about 2 volts to about 4 volts. The dummy memory cells may have a Vt-level that lies within a voltage range of about −2 volts to about 4 volts. The programmable drain select gate threshold voltages may be programmed and maintained at a Vt-level that lies within a voltage range of about 1 volt to about 1.5 volts.

Table 1 provides an example of programming a programmable drain select gate (SG(D)), such as drain select gates 212 of FIG. 2. It will be apparent that other combinations of voltages may be utilized to develop an appropriate voltage drop across the charge storage node to effect a change in threshold voltage of the programmable drain select gates.

TABLE 1

Example of Programming of Drain Select Gate

| | SL | SG(S)L | $WL_{SL1}$ | $WL_{ML1}$-$WL_{MLN}$ | $WL_{SL2}$ | $WL_{DUM}$ | SG(D)L | BL |
|---|---|---|---|---|---|---|---|---|
| PGM SG(D) | 1.5 V | 0.5 V | 8 V | 8 V | 8 V | 10 V | 15 V | 0 V |
| Verify SG(D) | 0 V | 4 V | 6 V | 6 V | 6 V | 6 V | 1 V | float |

For example, to program selected programmable drain select gates 212 of FIG. 2, a voltage of about 1.5 volts is applied to source line (SL) 216; a voltage of about 0.5 volt is applied to source select line (SG(S)L) 214; a voltage of about 8 volts is applied to word line ($WL_{SL1}$) $202_{SL1}$, to word lines ($WL_{ML1}$-$WL_{MLN}$) $202_{ML1}$-$202_{MLN}$, and to word line ($WL_{SL2}$) $202_{SL2}$; a voltage of about 10 volts is applied to dummy word line ($WL_{DUM}$) $202_{DUM}$, a programming voltage of about 15 volts is applied to drain select line (SG(D)L) 215; a voltage of about 0 volts is applied to the bit lines (BL) 204 corresponding to the drain select gates selected for programming; and an inhibit voltage of about 2.5 is applied to the remaining bit lines 204 corresponding to the drain select gates not selected for programming.

Subsequently, a program verify is performed to determine whether the programmable drain select gates selected for programming are programmed to a particular threshold voltage. For example, the program verify may include applying pre-charge voltage (e.g., about Vcc) to the bit lines corresponding to the programmable drain select gates selected for programming and subsequently removing the pre-charge voltage to allow the bit lines to float while applying a voltage of about 0 volts to source line SL, a voltage of about 4 volts to source select line SG(S)L, a voltage of about 6 volts to word line $WL_{SL1}$, to word lines $WL_{ML1}$-$WL_{MLN}$, to word line $WL_{SL1}$, and to dummy word line $WL_{DUM}$ $202_{DUM}$, and a program verify voltage of about 1 volt to drain select line SG(D)L.

The voltages applied to source select line SG(S)L, word line $WL_{SL1}$, to word lines $WL_{ML1}$-$WL_{MLN}$, to word line $WL_{SL2}$, and to dummy word line $WL_{DUM}$ places them in a state that allows the source select gates and the memory cells respectively corresponding to the pre-charged bit lines to pass current between the pre-charged bit lines and the source line, when the program verify voltage applied to the drain select line SG(D)L activates the programmable drain select gates. The current flow causes the corresponding bit lines to discharge if the programmable drain select gates are activated.

When the program verify voltage applied to the drain select line SG(D)L activates the programmable drain select gates, then the programmable drain select gates have the desired threshold voltage, and the programmed state can be detected by the discharging of the bit lines. However, when the program verify voltage applied to the drain select line SG(D)L fails to activate a programmable drain select gate, then that programmable drain select gate is not fully programmed, and the non-programmed state can be detected by the corresponding bit line failing to discharge. In the event that a programmable drain select gate does not activate in response to the program verify voltage, the programming operation may be repeated as to those programmable drain select gates while other programmable drain select gates may be inhibited from further programming. Subsequent programming operations may, as is common with the programming of memory cells, include increasing the gate voltage of the programmable drain select gate, i.e., the voltage applied to the drain select line SG(D)L, during the programming operation. This process may be repeated until all of the programmable drain select gates have reached the desired threshold voltage, or until a failure condition is reached, e.g., a maximum number of programming operations is reached before reaching the desired threshold voltage.

Table 2 provides an example of an erase operation performed on a memory array, such as memory array 200 of FIG. 2.

TABLE 2

Example of Array Erase Operation

|  | SL | SG(S)L | $WL_{SL1}$ | $WL_{ML1}$-$WL_{MLN}$ | $WL_{SL2}$ | $WL_{DUM}$ | SG(D)L | BL |
|---|---|---|---|---|---|---|---|---|
| ERS | 25 V | 20 V | 3 V | 0.5 V | 3 V | 10 V | 18 V | float |
| ERS Verify | 3 V | 4 V | 0 V | 0 V | 0 V | 6 V | 6 V | float |

For example, an erase operation may include allowing the bit lines 204 to float while applying an erase voltage $V_{ERS}$ of about 25 volts to source line SL, and thus to the p-well 201, a voltage of about 20 volts to source select line SG(S)L, a voltage of about 3 volts to word line $WL_{SL1}$, a voltage of about 0.5 volt to word lines $WL_{ML1}$-$WL_{MLN}$, a voltage of about 3 volts to word line $WL_{SL2}$, a voltage of about 10 volts to dummy word line $WL_{DUM}$, and a voltage of about 18 volts to drain select line SG(D)L.

The difference between the voltage applied to drain select line SG(D)L and the voltage on p-well 201, and thus the voltage difference across the programmable drain select gates, is insufficient to produce a significant change in the Vt-level of the programmable drain select gates, so that the programmable drain select gates are not erased. The voltage differential between the p-well and the drain select line SG(D)L is insufficient to erase the programmable drain select gates, in that it is desirable to avoid re-programming the programmable drain select gates each time a block of memory cells is erased.

The presence of dummy word line $WL_{DUM}$ and the corresponding dummy memory cells reduces the likelihood of the threshold voltage of the programmable drain select gates being changed during the erase operation. For example, the voltage applied to dummy word line $WL_{DUM}$ is an intermediate voltage, or de-bias voltage $V_{DB}$, between the erase voltage $V_{ERS}$ and a ground potential. For one embodiment, this de-bias voltage $V_{DB}$ lies between the voltage applied to word line $WL_{SL2}$ and the voltage applied to drain select line SG(D) L, thereby reducing the coupling between adjacent lines if the dummy word line $WL_{DUM}$ were not used and thus reducing trap-up during erase operations.

The de-bias voltage $V_{DB}$ should be high enough to mitigate trap-up in the programmable drain select gate. However, this can reduce or even inhibit the erase operation as to the memory cells of the dummy word line $WL_{DUM}$. Thus, the de-bias voltage $V_{DB}$ should also be low enough to mitigate trap-up in the dummy word lines $WL_{DUM}$ themselves and in adjacent memory cells in order to maintain the threshold voltages of the memory cells of the dummy word line $WL_{DUM}$ below the read voltages. Where multi-level cells are erased to threshold voltages well below the ground potential, these two constraints may be difficult to attain if the memory cells adjacent the dummy word line $WL_{DUM}$ are operated as multi-level cells. Accordingly, for some embodiments, memory cells of word line $WL_{SL2}$ next to the dummy word line $WL_{DUM}$ are operated as single-level cells. This facilitates a reduction in the coupling between these two word lines as single-level cells do not entail the same level of erasure as do multi-level cells. Compare, for example, FIGS. 4B and 4C. Such operation reduces the risk of trap-up in the memory cells of the dummy word line $WL_{DUM}$ and helps to maintain their threshold voltages below the read voltages.

Subsequent to the erase operation, an erase verify may be performed. For example, an erase verify operation may include applying a pre-charge voltage (e.g., about Vcc) to the bit lines and subsequently allowing the bit lines to float while applying a voltage of about 3 volts to source line SL, a voltage of about 4 volts to source select line SG(S)L, an erase verify voltage of about 0 volts to word line $WL_{SL1}$, to word lines $WL_{ML1}$-$WL_{MLN}$, and to word line $WL_{SL2}$, a voltage of about 6 volts to dummy word line $WL_{DUM}$, and a voltage of about 6 volts to drain select line SG(D)L.

The voltages applied to source select line SG(S)L, to dummy word line $WL_{DUM}$, and drain select line SG(D)L during the erase verify places them in a state that allows the source select gates and the dummy memory cells respectively corresponding to the pre-charged bit lines to pass current between the pre-charged bit lines and the source line, when the erase verify voltage applied to the word line $WL_{SL1}$, to word lines $WL_{ML1}$-$WL_{MLN}$, and to word line $WL_{SL2}$ activates the memory cells coupled thereto. The current flow causes the bit lines to discharge if the memory cells are activated in response to the erase verify voltage.

When the erase verify voltage applied to word line $WL_{SL1}$, to word lines $WL_{ML1}$-$WL_{MLN}$, and to word line $WL_{SL2}$ activates the memory cells coupled thereto, then those memory cells are deemed erased, and the erased state can be detected by the discharging of the corresponding bit lines. However, when the erase verify voltage applied to a word line of word line $WL_{SL1}$, word lines $WL_{ML1}$-$WL_{MLN}$, and word line $WL_{SL2}$ fails to activate a memory cell coupled thereto, then that memory cell is not fully erased, and the non-erased state can be detected by the corresponding bit line failing to discharge. In the event that a memory cell fails to program, the erase operation may be repeated until all of the memory cells are deemed to be erased, or until a failure condition is reached, e.g., a maximum number of erase operations is reached before reaching the erased state for all of the memory cells involved in the erase operation, i.e., all of the memory cells coupled to word line $WL_{SL1}$, to word lines $WL_{ML1}$-$WL_{MLN}$, and to word line $WL_{SL2}$.

Table 3 provides an example of a read operation performed on a memory array, such as memory array 200 of FIG. 2, e.g. to read single-level and/or multi-level memory cells.

TABLE 3

Example Read Operation

| | SL | SG(S)L | $WL_{SL1}$ | $WL_{ML1}$-$WL_{MLN}$ | $WL_{SL2}$ | $WL_{DUM}$ | SG(D)L | BL |
|---|---|---|---|---|---|---|---|---|
| READ | 0 V | 4 V | $V_{rdSL1}$ or 6 V | $V_{rdML}$ or 6 V | $V_{rdSL2}$ or 6 V | 6 V | 6 V | 0.5 V |

In general, during a read operation, current flow between the bit line and the source line is determined by the data state of a target memory cell. Both select gates and the remaining memory cells in a string, including the dummy memory cell, receive a voltage on their control gates to act as pass transistors, i.e., to activate them regardless of their threshold voltage. For example, a read operation may include applying a voltage of about 0 volts to source line SL, a voltage of about 4 volts to source select line SG(S)L, a voltage of about 6 volts to dummy word line $WL_{DUM}$, a voltage of about 6 volts to drain select line SG(D)L, and a voltage of about 0.5 volt to the bit lines BL corresponding to the columns containing the memory cells to be read. A read voltage $V_{rdSL1}$ of about the Vt-level corresponding to the programmed state of the single-level memory cell $208_{SLC1}$ to be read, e.g., about 2 volts, is applied to word line $WL_{SL1}$, when a single-level memory cell $208_{SLC1}$ is to be read. If none of the single-level memory cells $208_{SLC1}$ are to be read, a pass voltage, e.g., of about 6 volts, is applied to word line $WL_{SL1}$. A read voltage $V_{rdSL2}$ of about the Vt-level corresponding to the programmed state of the single-level memory cell $208_{SLC2}$ to be read, e.g., about 2 volts, is applied to word line $WL_{SL2}$, when a single-level memory cell $208_{SLC2}$ is to be read. If none of the single-level memory cells $208_{SLC2}$ are to be read, a pass voltage, e.g., of about 6 volts, is applied to word line $WL_{SL2}$.

A read voltage $V_{rdML}$ of about the Vt-levels corresponding to each of the programmed states of a multiple-level memory cell $208_{MLC1}$ is individually applied to the respective word line $WL_{ML}$, when a multiple-level memory cell $208_{MLC}$ is to be read. For example, voltages $V_{rdML}$ corresponding to the Vt-level ranges corresponding to logic values 01, 00, and 10 (FIG. 3b) may be applied to selected word lines of word lines $WL_{ML1}$-$WL_{MLN}$ to determine whether those memory cells are in the corresponding state. A pass voltage, e.g., of about 6 volts, may be applied to unselected word lines of word lines $WL_{ML1}$-$WL_{MLN}$.

Table 4 provides an example of a programming operation performed on a memory array, such as memory array 200 of FIG. 2, e.g. to program the multi-level memory cells.

For example, to program a multi-level memory cell $208_{MLC}$ of FIG. 2, a voltage of about 1.5 volts is applied to source line SL; a voltage of about 1 volt is applied to source select line SG(S)L; a pass voltage of about 10 volts is applied to word line $WL_{SL1}$; to unselected word lines of word lines $WL_{ML1}$-$WL_{MLN}$, to word line $WL_{SL2}$, and to dummy word line $WL_{DUM}$; a programming voltage of about 25 volts is applied to a selected word line of word lines $WL_{ML1}$-$WL_{MLN}$; a voltage of about 2.5 volts is applied to drain select line SG(D)L; a voltage of about 0 volts is applied to the bit lines BL corresponding to the NAND strings containing memory cells selected for programming; and an inhibit voltage of about 2.5 volts is applied to the remaining bit lines BL corresponding to NAND strings containing memory cells not selected for programming.

The non-programmable source select gates, such as fixed threshold voltage FETs, as disclosed herein allow for a tighter Vt-level distribution and improved switching capability, as compared to using programmable source select gates. In addition, using a non-programmable source select gates eliminates the need for interposing a dummy word line between the source select gates 210 and single-level memory cells $208_{SLC1}$ as non-programmable source select gates do not have the coupling concerns of programmable source select gates.

Using the programmable drain select gates, as disclosed herein, allow for a tighter Vt-level distribution than when using non-programmable drain select gates, such as fixed threshold voltage FETs. The tighter Vt-level distribution results in less variation in the Vt-level for the drain select gates coupled to a given drain select line. This facilitates a more uniform performance of the all of the drain select gates coupled to a given drain select line in response to an activation voltage being applied to the drain select line. In addition, the use of programmable drain select gates allows for the use of higher control gate voltages without adversely affecting reliability, which allows for a higher seed voltage being passed to the channel through the programmable drain select gate. This can facilitate an improvement in boosting performance and/or a lowering of inhibit voltages under comparable programming conditions.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments

TABLE 4

Example Program Operation for Multi-Level Cells

| | SL | SG(S)L | $WL_{SL1}$ | $WL_{ML1}$-$WL_{MLN}$ | $WL_{SL2}$ | $WL_{DUM}$ | SG(D)L | BL |
|---|---|---|---|---|---|---|---|---|
| PGM | 1.5 V | 1 V | 10 V | 25/10 V | 10 V | 10 V | 2.5 V | 0/2.5 V |

What is claimed is:

1. A memory device, comprising:
   control logic; and
   a memory array, comprising:
   a string of series-coupled memory cells;
   a non-programmable select gate coupled in series to a first end of the string of series-coupled memory cells; and
   a programmable select gate coupled in series to a second end of the string of series-coupled memory cells;
   wherein the control logic is configured to program first and second memory cells of the string of series-coupled memory cells that are between and coupled in series with the programmable and non-programmable select gates as single-level memory cells; and
   wherein the control logic is configured to program memory cells of the string of series-coupled memory cells that are between and coupled in series with the first and second memory cells as multi-level memory cells.

2. The memory device of claim 1, wherein the control logic is configured to program a third memory cell of the string of series-coupled memory cells that is at the second end of the string of series-coupled memory cells and is coupled in series with the programmable select gate as a dummy memory cell.

3. The memory device of claim 2, wherein a source/drain region couples the third memory cell and the programmable select gate in series.

4. The memory device of claim 3, wherein another source/drain region couples the programmable select gate in series with a data line.

5. The memory device of claim 2, wherein the the third memory cell is between the programmable select gate and the first memory cell and is coupled in series with the first memory cell.

6. The memory device of claim 1, wherein a source/drain region couples the second memory cell and the non-programmable select gate in series.

7. The memory device of claim 6, wherein another source/drain region couples the non-programmable select gate in series with a source line.

8. The memory device of claim 1, wherein the non-programmable select gate is a fixed threshold voltage field effect transistor and the programmable select gate is a charge storage cell.

9. The memory device of claim 1, wherein the programmable and non-programmable select gates are respectively drain and source select gates.

10. The memory device of claim 1, wherein the programmable select gate and each memory cell comprises:
   a first dielectric;
   a charge storage node over the first dielectric;
   a second dielectric over the charge storage node; and
   a control gate over the second dielectric.

11. The memory device of claim 10, wherein the non-programmable select gate comprises:
   a gate dielectric; and
   a control gate over the gate dielectric.

12. A memory array, comprising:
   a source select line having a non-programmable source select gate coupled thereto for selectively coupling a string of series-coupled memory cells to a source line;
   a drain select line having a programmable drain select gate coupled thereto for selectively coupling the string of series-coupled memory cells to an associated data line; and
   a plurality of access lines interposed between the source select line and the drain select line and respectively coupled to the memory cells of the string of series-coupled memory cells;
   wherein the plurality of access lines comprises a dummy access line having a dummy memory cell of the string of series-coupled memory cells coupled thereto; and
   wherein the dummy access line is configured to receive a voltage during an erase operation of the memory array that lies between a voltage that is applied, during the erase operation, to an access line coupled to an adjacent memory cell in the string of series-coupled memory cells and a voltage that is applied, during the erase operation, to the drain select line.

13. The memory array of claim 12, wherein the drain select line is configured to receive a programming voltage for programming the programmable drain select gate and a program verify voltage for verifying whether the programmable drain select gate is programmed.

14. The memory array of claim 12, wherein the dummy memory cell is located between the adjacent memory cell in the string of series-coupled memory cells and the programmable drain select gate.

15. The memory array of claim 12, wherein the source line is configured to receive an erase voltage during the erase operation of the memory array that places a well in which the memory array is formed at the erase voltage and wherein the voltage applied to the drain select line during the erase operation is such that a difference between the erase voltage and the voltage applied to the drain select line during the erase operation is insufficient to erase the programmable drain select gate during the erase operation.

16. The memory array of claim 12, wherein the string of series-coupled memory cells comprises:
   a memory cell programmable as a single-level memory cell at an end of the string of series-coupled memory cells that is coupled in series with the non-programmable source select gate;
   a dummy memory cell at an opposite end of the string of series-coupled memory cells coupled in series with the programmable drain select gate;
   a plurality of memory cells programmable as multi-level memory cells located between the memory cell programmable as a single-level memory cell and the dummy memory cell; and
   an other memory cell programmable as a single-level memory cell interposed between the plurality of memory cells programmable as multi-level memory cells and the dummy memory cell.

17. A memory array, comprising:
   a plurality of non-programmable source select gates;
   a plurality of programmable drain select gates;
   a plurality of strings of series-coupled memory cells, each of the plurality of strings of series-coupled memory cells located between a non-programmable source select gate and a programmable drain select gate, the strings of series-coupled memory cells of the plurality of strings of series-coupled memory cells coupled in series on a one-to-one basis with the non-programmable source select gates of the plurality of non-programmable source select gates and the programmable drain select gates of the plurality of programmable drain select gates;

wherein each string of series-coupled memory cells of the plurality of strings of series-coupled memory cells, comprises:
- a dummy memory cell coupled in series with the programmable drain select gate coupled in series with the respective string of series-coupled memory cells;
- a first memory cell programmable as a single-level memory cell coupled in series with the non-programmable source select gate coupled in series with the respective string of series-coupled memory cells;
- a second memory cell programmable as a single-level memory cell coupled in series with the dummy memory cell; and
- a plurality of third memory cells programmable as a plurality of multi-level memory cells located between and coupled in series with the first and second memory cells.

18. The memory array of claim 17, wherein each non-programmable source select gate of the plurality of non-programmable source select gates, each programmable drain select gate of the plurality of programmable drain select gates, and each memory cell of each string of series-coupled memory cells of the plurality of strings of series-coupled memory cells comprises:
- a first dielectric over a common conductively doped region formed in a semiconductor;
- a first conductor formed over the first dielectric;
- a second dielectric; and
- a second conductor formed over the second dielectric.

19. The memory array of claim 18, wherein the first conductor and the second conductor of each non-programmable select gate are shorted together to form a control gate of the respective non-programmable select gate.

20. The memory array of claim 18, wherein the first conductor of each non-programmable select gate forms a control gate of the respective non-programmable select gate.

21. The memory array of claim 18, wherein the first conductor and the second conductor of each programmable select gate and each of the memory cells respectively form a floating gate and a control gate thereof.

* * * * *

UNITED STATES PATENT AND TRADEMARK OFFICE
CERTIFICATE OF CORRECTION

PATENT NO. : 8,228,735 B2
APPLICATION NO. : 12/707162
DATED : July 24, 2012
INVENTOR(S) : Giuseppina Puzzilli et al.

It is certified that error appears in the above-identified patent and that said Letters Patent is hereby corrected as shown below:

In column 15, line 37, in Claim 5, before "third" delete "the".

Signed and Sealed this
Twenty-fifth Day of September, 2012

David J. Kappos
*Director of the United States Patent and Trademark Office*